United States Patent
Hagino et al.

(10) Patent No.: US 8,294,494 B2
(45) Date of Patent: *Oct. 23, 2012

(54) TRIANGULAR-WAVE GENERATING CIRCUIT SYNCHRONIZED WITH AN EXTERNAL CIRCUIT

(75) Inventors: Junichi Hagino, Kyoto (JP); Kenichi Fukumoto, Kyoto (JP)

(73) Assignee: Rohm Co., Ltd. (JP)

( * ) Notice: Subject to any disclaimer, the term of this patent is extended or adjusted under 35 U.S.C. 154(b) by 889 days.

This patent is subject to a terminal disclaimer.

(21) Appl. No.: 12/440,351

(22) PCT Filed: Sep. 3, 2007

(86) PCT No.: PCT/JP2007/000949
§ 371 (c)(1),
(2), (4) Date: Mar. 6, 2009

(87) PCT Pub. No.: WO2008/029509
PCT Pub. Date: Mar. 13, 2008

(65) Prior Publication Data
US 2010/0039571 A1   Feb. 18, 2010

(30) Foreign Application Priority Data
Sep. 6, 2006 (JP) ................. 2006-241990

(51) Int. Cl.
*H03K 4/06* (2006.01)
*G09G 3/36* (2006.01)
(52) U.S. Cl. ...................... 327/131; 345/102
(58) Field of Classification Search ............. 327/131, 327/24; 331/45, 111, 143; 363/132, 136; 315/291–311, 274–287; 348/725, 790–792, 348/795, 751; 345/102, 87–90
See application file for complete search history.

(56) References Cited

U.S. PATENT DOCUMENTS
6,642,634 B2 * 11/2003 Nakajima .................. 327/228
(Continued)

FOREIGN PATENT DOCUMENTS
CN          1361626 A      7/2002
(Continued)

OTHER PUBLICATIONS
International Search Report for International Application No. PCT/JP2007/000949; Dated Sep. 25, 2007; with English translation.
(Continued)

*Primary Examiner* — Paulos Natnael
(74) *Attorney, Agent, or Firm* — Cantor Colburn LLP

(57) ABSTRACT

A charge-discharge circuit charges or discharges a capacitor having a fixed electric potential at one end. A first comparator compares an output voltage of the capacitor with a first threshold voltage and outputs a first comparison signal in accordance with a comparison result. An edge detecting circuit detects an edge of a synchronization signal input from the outside and having a frequency of about ½ of a triangular-wave signal generated by the triangular-wave generating circuit, and outputs an edge detection signal that will be at a predetermined level for each of the detected edges. A charge-discharge controller receives the first comparison signal that is output from the first comparator and the edge detection signal that is output from the edge detecting circuit, and switches between a charge state and a discharge state of the charge-discharge circuit in accordance with a level transition of these signals. A voltage of the capacitor is output as a triangular-wave signal.

12 Claims, 9 Drawing Sheets

U.S. PATENT DOCUMENTS

| | | | |
|---|---|---|---|
| 6,690,591 B2 * | 2/2004 | Min | 363/97 |
| 7,403,049 B2 * | 7/2008 | Uchimoto et al. | 327/131 |
| 7,557,622 B2 * | 7/2009 | Stanley | 327/131 |
| 7,948,282 B2 * | 5/2011 | Fukumoto | 327/131 |
| 2002/0104667 A1 | 8/2002 | Nakajima | |
| 2003/0169604 A1 | 9/2003 | Min | |
| 2010/0277090 A1 * | 11/2010 | Fukumoto | 315/291 |

FOREIGN PATENT DOCUMENTS

| | | |
|---|---|---|
| CN | 1444332 A | 9/2003 |
| JP | 62-169514 A | 7/1987 |
| JP | 6-230267 A | 8/1994 |
| JP | 2001-345682 A | 12/2001 |
| JP | 2002-199242 A | 7/2002 |
| JP | 2003-274668 A | 9/2003 |
| JP | 2004-72657 A | 3/2004 |
| JP | 2004-242403 A | 8/2004 |

OTHER PUBLICATIONS

International Preliminary Report on Patentability for International Application No. PCT/JP2007/000949 issued Mar. 10, 2009 with English translation.

Office Action for Chinese Application No. 200780001104.2 issued May 5, 2010 with English translation.

* cited by examiner

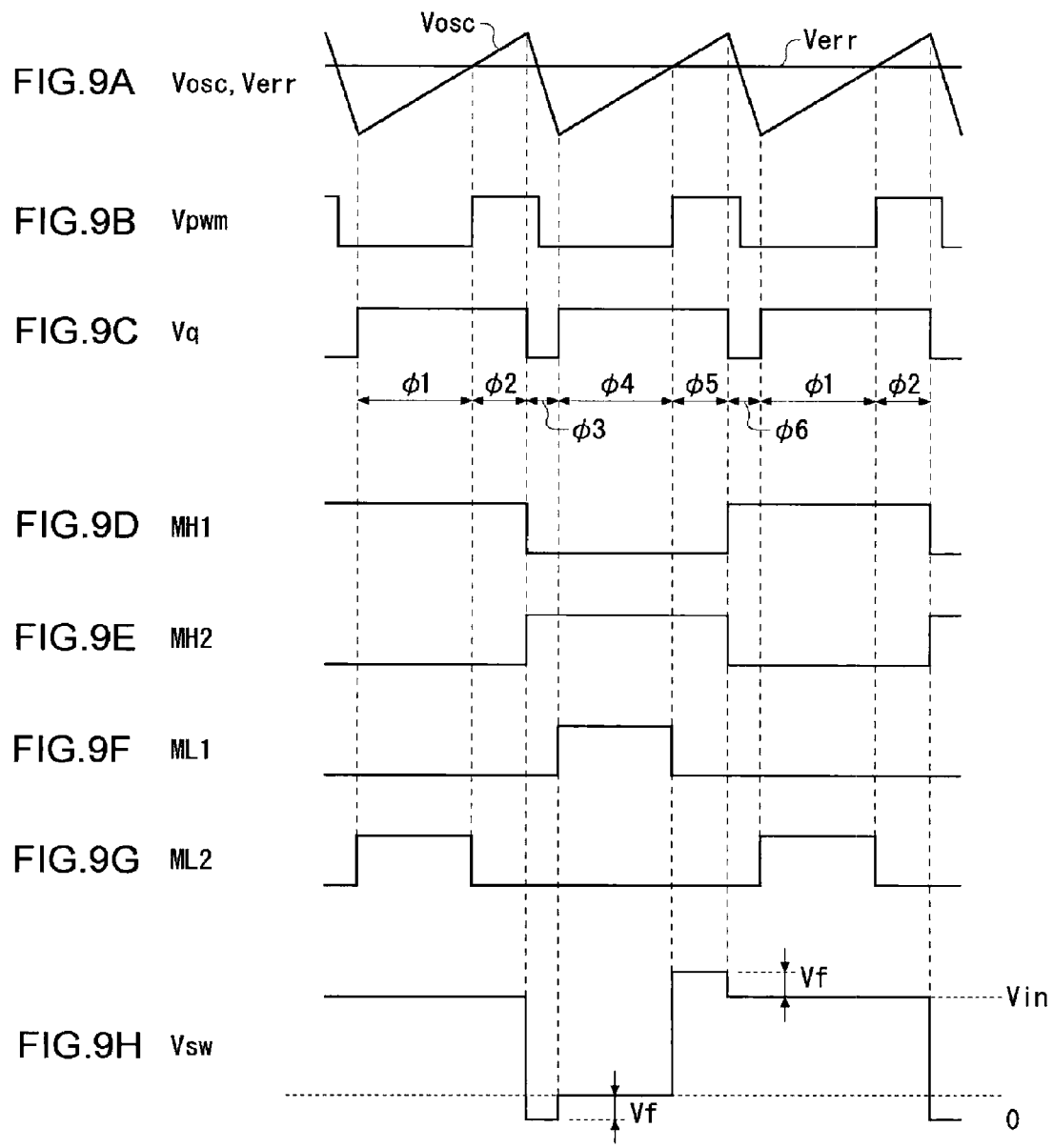

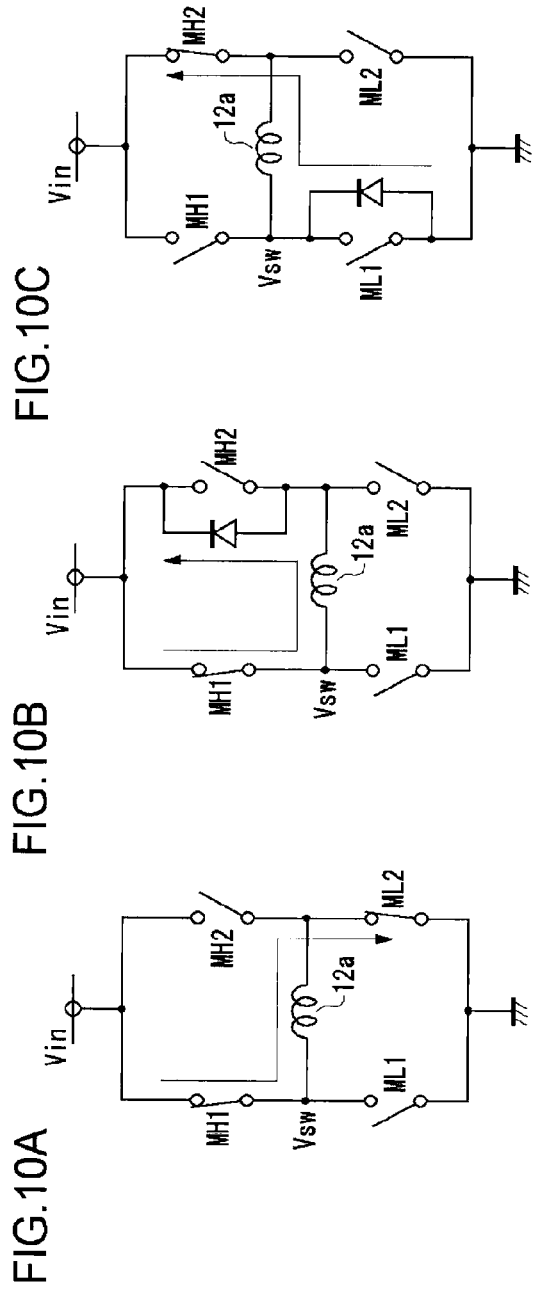

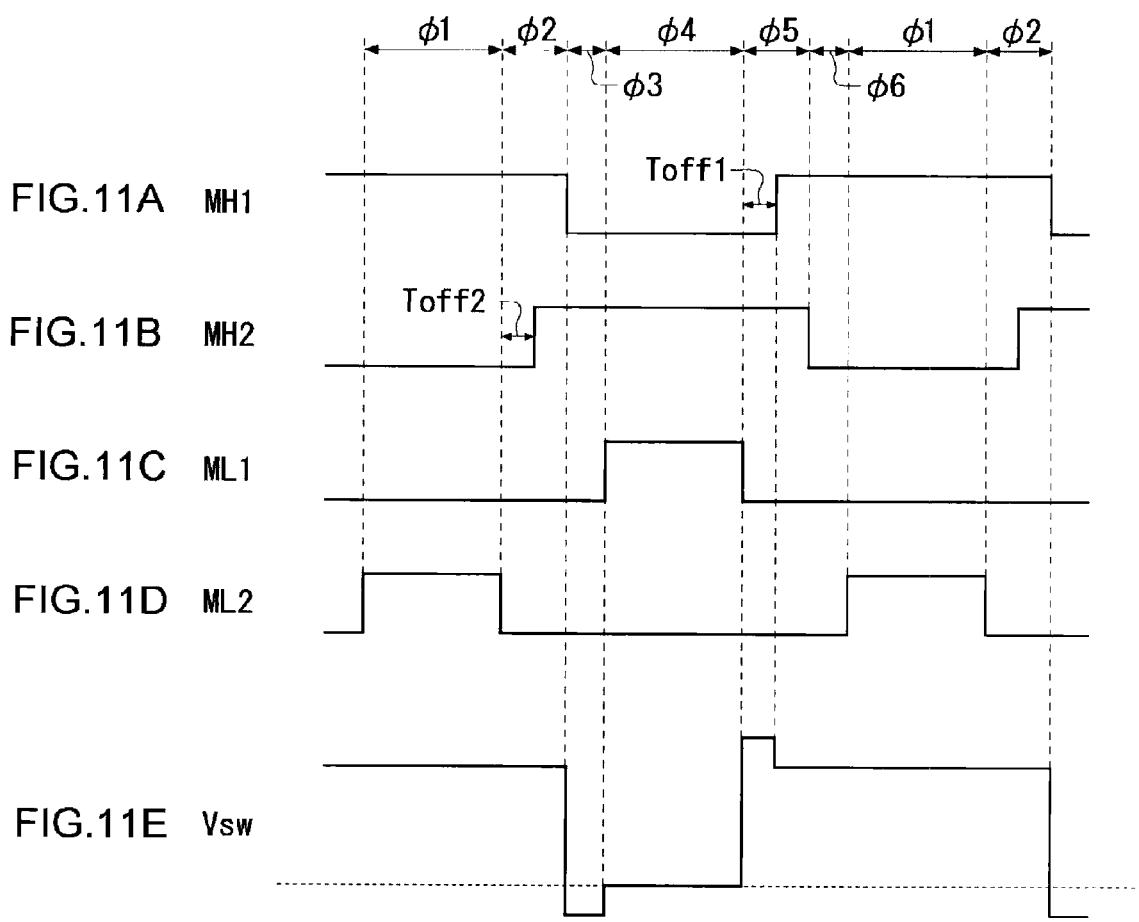

TRIANGULAR-WAVE GENERATING CIRCUIT SYNCHRONIZED WITH AN EXTERNAL CIRCUIT

CROSS REFERENCE TO RELATED APPLICATIONS

This is a U.S. national stage of application Ser. No. PCT/JP2007/000949, filed on 3 Sep. 2007. Priority under 35 U.S.C. §119(a) and 35 U.S.C. §365(b) is claimed from Japanese Application No. 2006-241990, filed 6 Sep. 2006, the disclosure of which is also incorporated herein by reference.

BACKGROUND OF THE INVENTION

1. Field of the Invention

The present invention relates to a triangular-wave generating circuit, and more particularly to a triangular-wave generating circuit that can be synchronized with an external circuit.

2. Description of the Related Art

A pulse width modulation method is widely used in a power supply apparatus such as an inverter that converts a direct current voltage into an alternating current voltage or a DC/DC converter that converts a direct current voltage into a direct current voltage, a motor driver circuit that drives a motor, or the like. In order to perform pulse width modulation, an error between a voltage to be controlled and a target voltage is amplified by an error amplifier, and an error voltage thus obtained is compared with a periodic voltage having a triangular-wave shape and having a constant frequency with use of a comparator, so as to perform the pulse width modulation.

For generating the periodic voltage having a triangular-wave shape used for such purposes, an analog triangular-wave generating circuit disclosed in the patent document 1 or the patent document 2 is widely used. The triangular-wave generating circuit charges and discharges a capacitor, and performs charging and discharging alternately by comparison with two threshold voltages, so as to generate a desired triangular-wave signal.

[Patent Document 1] Japanese Patent Application (Laid-Open) No. 2004-72657

[Patent Document 2] Japanese Patent Application (Laid-Open) No. 2001-345682

[Patent Document 3] Japanese Patent Application (Laid-Open) No. 2004-242403

Here, there may be cases in which it is desired to generate triangular-wave signals that are synchronized with each other in two different semiconductor integrated circuits (hereinafter also referred to as IC). For example, a case is considered in which two inverters are disposed at both ends of a fluorescent lamp that is used as a back light unit of a liquid crystal television set, and driving voltages having opposite phases are applied.

In the event that the phases of the triangular-wave signals used in performing the DC/AC conversion are shifted from each other in the two inverters, the voltages applied to both ends of the fluorescent lamp will not have opposite phases, thereby generating an inconvenience in the light-emitting state. Other than this, there may be a case in which it is desired to generate a triangular-wave signal that is synchronized with an external signal.

SUMMARY OF THE INVENTION

The present invention has been made in view of these problems, and a general purpose thereof is to provide a triangular-wave generating circuit capable of generating a triangular-wave signal that is synchronized with an external circuit.

In order to solve the aforementioned problems, a triangular-wave generating circuit according to a certain embodiment of the present invention includes a capacitor having a fixed electric potential at one end; a charge-discharge circuit that charges or discharges the capacitor; a first comparator that compares an output voltage of the other end of the capacitor with a first threshold voltage and outputs a first comparison signal in accordance with a comparison result; an edge detecting circuit that detects an edge of a synchronization signal input from the outside and having a frequency of about ½ of a triangular-wave signal generated by the triangular-wave generating circuit, and outputs an edge detection signal that will be at a predetermined level for each of the detected edges; and a charge-discharge controller that receives the first comparison signal output from the first comparator and the edge detection signal output from the edge detecting circuit, and switches between a charge state and a discharge state of the charge-discharge circuit in accordance with a level transition of these signals. A voltage of the capacitor is output as a triangular-wave signal.

According to this embodiment, when a plurality of these triangular-wave generating circuits are disposed, either one of the timing of the start of charging and the timing of the start of discharging can be matched to the edge of a common synchronization signal, whereby a plurality of the generated triangular-wave signals can be synchronized.

The charge-discharge controller may include a flip-flop that is set and reset by the first comparison signal and the edge detection signal, and may switch between the charge state and the discharge state of the charge-discharge circuit in accordance with an output of the flip-flop.

The triangular-wave generating circuit according to a certain embodiment may further include a second comparator that compares a voltage of the other end of the capacitor with a second threshold voltage that is different from the first threshold voltage, and outputs a second comparison signal in accordance with a comparison result; and a toggle circuit that receives the second comparison signal output from the second comparator, generates a toggle signal that undergoes level transition each time the second comparison signal reaches a predetermined level, and outputs the signal to the outside of the triangular-wave generating circuit.

In this case, since the frequency of the toggle signal is about ½ of the frequency of the triangular-wave signal, this toggle signal can be used as a synchronization signal of its own, or as a synchronization signal of a different triangular-wave generating circuit.

The triangular-wave generating circuit may further include a third comparator that compares the synchronization signal input from the outside with a predetermined threshold voltage, wherein the edge detecting circuit may detect an edge of an output signal of the third comparator.

In this case, even if the amplitude of the synchronization signal is different from the voltage level at which the triangular-wave generating circuit operates, the edge can be detected with certainty by suitably setting the threshold voltage.

The charge-discharge circuit may include a first current source that supplies an electric current into the capacitor, and a second current source that withdraws an electric current from the capacitor, and may control on-off of at least one of the first and second current sources with use of an output signal of the flip-flop. The second current source may be constructed to lose its discharging function when the voltage of the capacitor drops to lower than or equal to a predetermined voltage.

In this case, even if the timing from the discharging to the charging is delayed, the voltage of the capacitor can be kept above the lower limit value.

The triangular-wave generating circuit according to a certain embodiment may be monolithically integrated on one semiconductor substrate. The term "monolithically integrated" includes a case in which all of the constituent elements of the circuit are formed on the semiconductor substrate and a case in which principal constituent elements of the circuit are monolithically integrated. Also, for adjustment of the circuit constants, a part of the resistors, the capacitors, and the like may be disposed outside of the semiconductor substrate. By integrating the triangular-wave generating circuits into one LSI, the circuit area can be reduced, and the characteristics of the circuit elements can be maintained to be uniform.

Another embodiment of the present invention is an inverter. This inverter includes a transformer; a first high-side transistor having one end connected to an input terminal to which an input voltage is applied and having the other end connected to a first terminal of a primary coil of the transformer; a first low-side transistor having one end connected to a potential-fixed terminal with a fixed electric potential and having the other end connected to the first terminal of the primary coil; a second high-side transistor having one end connected to the input terminal and having the other end connected to a second terminal of the primary coil; a second low-side transistor having one end connected to the potential-fixed terminal and having the other end connected to the second terminal of the primary coil; a current-voltage converter that converts an electric current through a secondary coil of the transformer into a voltage and outputs the voltage as a detection voltage; a triangular-wave generating circuit described above that generates a triangular-wave signal; an error amplifier that outputs an error voltage in accordance with an error between the detection voltage and a predetermined reference voltage; and a logic controller that controls on-off of the first and second high-side transistors and the first and second low-side transistors on the basis of the error voltage output from the error amplifier and the triangular-wave signal generated by the triangular-wave generating circuit.

According to this embodiment, the triangular-wave signal output from the triangular-wave generating circuit can be synchronized with the synchronization signal, so that the operation itself of the inverter can be synchronized with the synchronization signal.

According to still another embodiment of the present invention, there is provided a light-emitting apparatus. This light-emitting apparatus includes a fluorescent lamp; and two inverters described above that are disposed at both ends of the fluorescent lamp and supply driving voltages having opposite phases with each other to the fluorescent lamp.

According to this embodiment, by using the identical synchronization signal between the two inverters, the triangular-wave generating circuits located in the inside can be synchronized, whereby driving voltages having opposite phases can be suitably generated to realize a good light-emitting state.

The triangular-wave generating circuit included in each of the two inverters may further include a second comparator that compares a voltage of the other end of the capacitor with a second threshold voltage that is different from the first threshold voltage, and outputs a second comparison signal in accordance with a comparison result; and a toggle circuit that receives the second comparison signal output from the second comparator, generates a toggle signal that undergoes level transition each time the second comparison signal reaches a predetermined level, and outputs to the outside of the triangular-wave generating circuit. A first triangular-wave generating circuit included in a first inverter of the two inverters may generate the triangular-wave signal by receiving the toggle signal output from itself as the synchronization signal, and a second triangular-wave generating circuit included in a second inverter of the two inverters may generate the triangular-wave signal by receiving the toggle signal output from the first triangular-wave generating circuit included in the first inverter as the synchronization signal.

Still another embodiment of the present invention relates to a liquid crystal television set. This liquid crystal television set includes a liquid crystal panel and a plurality of light-emitting apparatus described above that are disposed on a back surface of the liquid crystal panel.

According to this embodiment, the brightness irregularity of the light-emitting apparatus used as a back light unit can be restrained.

Still another embodiment of the present invention relates to a method for generating a triangular-wave signal. This generating method includes generating a first comparison signal that reaches a predetermined level when a voltage of a capacitor having a fixed electric potential at one end drops to a predetermined first threshold voltage while the capacitor is being discharged; generating a toggle signal that undergoes level transition each time the first comparison signal reaches the predetermined level, and outputting the signal to the outside; detecting an edge of a synchronization signal input from the outside and having a frequency of about ½ of a triangular-wave signal generated by the present method; starting charging the capacitor when the edge is detected; and starting discharging the capacitor when the voltage of the capacitor rises to a predetermined second threshold voltage.

In a certain embodiment, the toggle signal may be used as the synchronization signal.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 9A to 9H are time charts showing an operation state of an inverter;

FIGS. 10A to 10F are circuit diagrams showing a flow of an electric current of an H-bridge circuit of the inverter of FIG. 6; and FIGS. 11A to 11E are time charts showing an operation state of an inverter according to a modified example.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state in which "the member A is connected to the member B" includes a case in which the member A and the member B are directly connected with each other physically and a case in which the member A and the member B are indirectly connected with each other via another member that does not affect the electrical connection state.

Similarly, the state in which "the member C is disposed between the member A and the member B" includes a case in which the member A and the member C, or the member B and the member C are directly connected with each other and a case in which they are connected with each other via another member that does not affect the electrical connection state.

Figure 1:
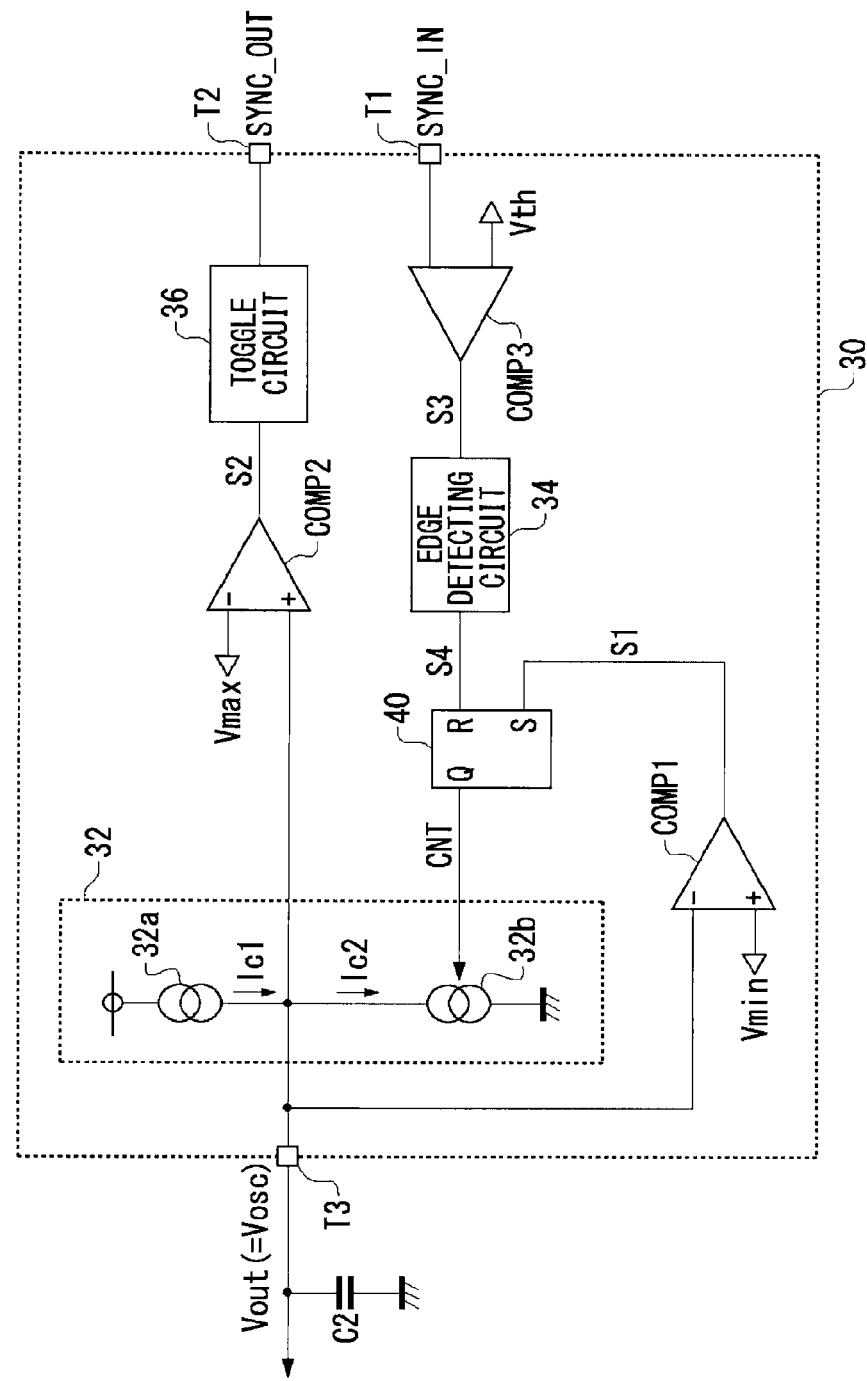
FIG. 1 is a circuit diagram showing a construction of a triangular-wave generating circuit according to the present embodiment.
Figure 2:
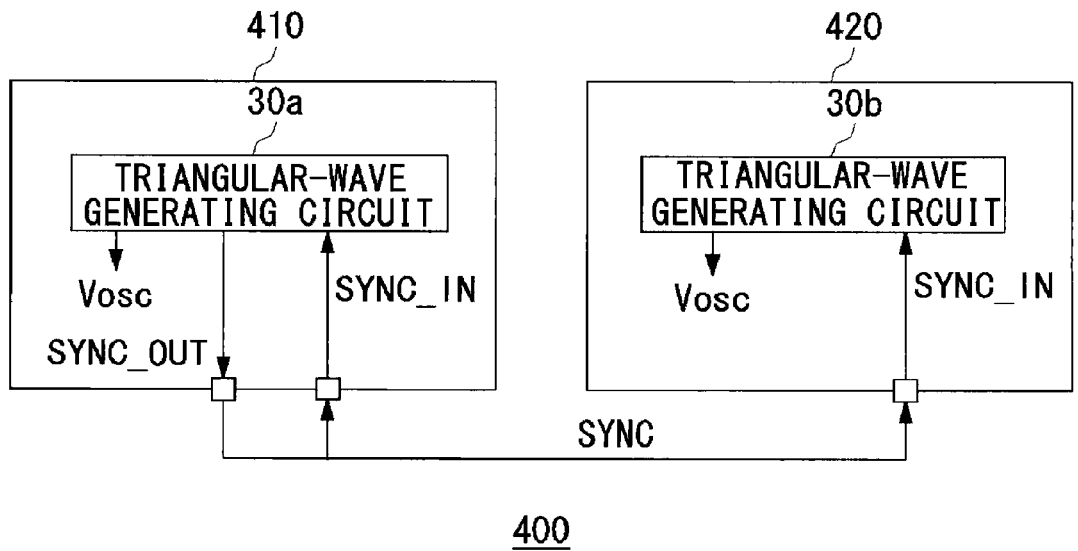
FIG. 2 is a block diagram showing a construction of a system in which the triangular-wave generating circuit of FIG. 1 is used.

FIG. 1 is a circuit diagram showing a construction of a triangular-wave generating circuit 30 according to the present embodiment. FIG. 2 is a block diagram showing a construction of a system 400 in which the triangular-wave generating circuit 30 of FIG. 1 is used. First, with reference to FIG. 2, a summary of the operation of the triangular-wave generating circuit 30 according to the present embodiment will be described.

The system 400 includes a first circuit 410 and a second circuit 420. The first circuit 410 and the second circuit 420 may be circuits provided with the same function, or may be circuits provided with different functions. The first circuit 410 and the second circuit 420 each include the triangular-wave generating circuit 30 of FIG. 1 according to the present embodiment. With regard to the triangular-wave generating circuit 30a of the first circuit 410 and the triangular-wave generating circuit 30b of the second circuit 420, one of them operates as a master circuit, and the other of them operates as a slave circuit. In the present embodiment, description will be given assuming that the triangular-wave generating circuit 30a of the first circuit 410 is on a master side, and the triangular-wave generating circuit 30b of the second circuit 420 is on a slave side.

The triangular-wave generating circuit 30a on the master side and the triangular-wave generating circuit 30b on the slave side generate a triangular-wave signal Vosc having a predetermined frequency f on the basis of a common synchronization signal SYNC_IN. Also, the triangular-wave generating circuit 30a on the master side outputs a synchronization signal SYNC_OUT having a frequency of f/2 to the triangular-wave generating circuit 30b on the slave side. The synchronization signal SYNC_OUT that is output from the triangular-wave generating circuit 30a is used as the synchronization signal SYNC_IN of the triangular-wave generating circuit 30b, and also is used as the synchronization signal SYNC_IN of the triangular-wave generating circuit 30a itself. Though the triangular-wave generating circuit 30b also generates a synchronization signal SYNC_OUT, this is not illustrated in the drawings because it is not used.

Returning to FIG. 1, the construction of the triangular-wave generating circuits 30a, 30b will be described. In the following description, the triangular-wave generating circuit 30a on the master side and the triangular-wave generating circuit 30b on the slave side will not be distinguished from each other, and will be described by being simply referred to as a triangular-wave generating circuit 30.

The triangular-wave generating circuit 30 according to the present embodiment includes a capacitor C2, a charge-discharge circuit 32, an edge detecting circuit 34, a toggle circuit 36, a charge-discharge controller 40, a first comparator COMP1, a second comparator COMP2, and a third comparator COMP3. Also, the triangular-wave generating circuit 30 is provided with a synchronization input terminal T1, a synchronization output terminal T2, and a capacitor terminal T3 as terminals for input and output of signals. The synchronization signal SYNC_IN is input from the outside to the synchronization input terminal T1. The synchronization signal SYNC_OUT is output from the synchronization output terminal T2. Also, an external capacitor C2 is connected to the capacitor terminal T3. As described above, the triangular-wave generating circuit 30 generates a triangular-wave signal Vosc in synchronization with the synchronization signal SYNC_IN input from the outside. As described above, the frequency of the synchronization signal SYNC_IN is approximately ½ of the frequency of the triangular-wave signal Vosc.

One end of the capacitor C2 is grounded so as to have a fixed electric potential. The charge-discharge circuit 32 includes a first current source 32a that supplies a charging current Ic1 into the capacitor C2, and a second current source 32b that withdraws a discharging current Ic2 from the capacitor C2.

The charge-discharge circuit 32 charges or discharges the capacitor C2 by controlling the on-off of at least one of the first current source 32a and the second current source 32b. In the present embodiment, Ic2=Ic1×n (where n is a constant greater than 1), and the on-off state of the second current source 32b is switched. When the second current source 32b is turned off, the capacitor C2 is charged with the electric current Ic1. When the second current source 32b is turned on, the capacitor C2 is discharged with the electric current (Ic2−Ic1).

The switching of the charge-discharge state of the charge-discharge circuit 32 is carried out on the basis of the control signal CNT. In the present embodiment, it will be assumed that, when the control signal CNT is at a high level, the second current source 32b is turned off to be set in the charging state, and that, when the control signal CNT is at a low level, the second current source 32b is turned on to be set in the discharging state.

The voltage generated at the capacitor C2 is the output voltage Vout of the triangular-wave generating circuit 30, and is output as the triangular-wave signal Vosc.

The first comparator COMP1 compares the output voltage Vout with a predetermined first threshold voltage (hereinafter referred to as the minimum threshold voltage Vmin), and outputs a first comparison signal S1 in accordance with the comparison result. The first comparison signal S1 will be at a high level when Vout<Vmin, and will be at a low level when Vout>Vmin. The first comparison signal S1 is output to the charge-discharge controller 40. Here, since the response speed of the first comparator COMP1 is finite, a case is conceivable in which a delay is generated if the gradient of the voltage change of the generated triangular-wave signal Vosc is large. In this case, the minimum threshold voltage Vmin is preferably shifted to the high electric potential side in consideration of the delay time.

The third comparator COMP3 is disposed for converting the signal level of the synchronization signal SYNC_IN input to the synchronization input terminal T1 into voltages of high level and low level within the triangular-wave generating circuit 30. Since the synchronization signal SYNC_IN is given from the outside of the triangular-wave generating circuit 30, a case may be conceivable in which, when the signal level is too small, the synchronization signal SYNC_IN will not reach the threshold value of circuit elements within the triangular-wave generating circuit 30, whereby the inverter cannot be inverted or the flip-flop cannot be set or reset. The third comparator COMP 3 compares the synchronization signal SYNC_IN with a predetermined threshold voltage Vth and converts the signal level thereof into a high-level voltage (Vdd) and a low-level voltage (GND=0V) in the inside of the triangular-wave generating circuit 30. The synchronization signal having a signal level converted by the third comparator COMP3 will be denoted as S3.

By disposing the third comparator COMP3, the synchronization signal SYNC_IN can be used as a synchronization signal when the voltage corresponding to the high level of the synchronization signal SYNC_IN is higher than the threshold voltage Vth.

The edge detecting circuit 34 detects an edge of the synchronization signal S3 having a frequency of about ½ of the triangular-wave signal Vosc (Vout) generated by the triangular-wave generating circuit 30, and outputs an edge detection signal S4 that will be at a predetermined level (hereinafter referred to as a high level) for each of the detected edges. The edge detection signal S4 is input into the charge-discharge controller 40.

Figure 3:
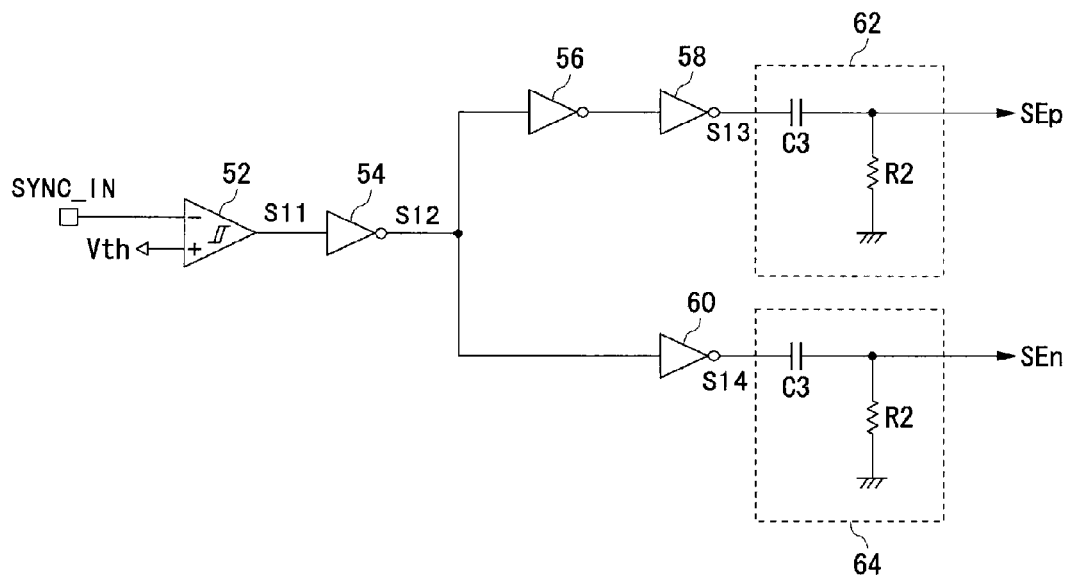
FIG. 3 is a circuit diagram showing a construction example of an edge detecting circuit.

FIG. 3 is a circuit diagram showing a construction example of the edge detecting circuit 34. The edge detecting circuit 34 includes a hysteresis comparator 52, inverters 54, 56, 58, 60, and differentiators 62, 64.

The synchronization signal SYNC_IN is input to the inverting input terminal of the hysteresis comparator 52. The threshold voltage Vth is input to the non-inverting input terminal of the hysteresis comparator 52. Noise components of the synchronization signal SYNC_IN are removed and the logic value thereof is inverted by the hysteresis comparator 52 for output. The output signal S11 of the hysteresis comparator 52 is input into the inverter 54. The inverter 54 inverts the output signal S11 of the hysteresis comparator 52. The output signal S12 of the inverter 54 is output respectively to the inverter 56 and the inverter 60.

The inverters 56, 58 invert the output signal S12 of the inverter 54 two times, and outputs it to the differentiator 62. The differentiator 62 includes a capacitor C3 and a resistor R2 and outputs, as a positive edge detection signal SEp, a voltage obtained by differentiating the output signal S13 of the inverter 58. Also, the inverter 60 inverts the output signal S12 of the inverter 54 once and outputs it to the differentiator 64. The differentiator 64 outputs, as a negative edge detection signal SEn, a voltage obtained by differentiating the output signal S14 of the inverter 60. From the edge detection circuit 34 constructed as shown above, two edge detection signals SE that will be at a high level respectively by the positive edge and the negative edge of the synchronization signal SYNC_IN are output.

Returning to FIG. 1, the charge-discharge controller 40 makes reference to the first comparison signal S1 that is output from the first comparator COMP1 and the edge detection signal S4 that is output from the edge detection circuit 34, so as to switch between the charge state and the discharge state of the charge-discharge circuit 32 in accordance with a level transition of these signals. In the present embodiment, the charge-discharge controller 40 is constructed to include a flip-flop that is set and reset by the first comparison signal S1 and the edge detection signal S4. The first comparison signal S1 is input to the set terminal of the flip-flop, and the edge detection signal S4 is input to the reset terminal of the flip-flop. The charge-discharge controller 40 switches between the charge stage and the discharge state of the charge-discharge circuit 32 using the output signal Q of the flip-flop as a control signal CNT.

The second comparator COMP2 compares the output voltage Vout of the capacitor C2 with a predetermined second threshold voltage (hereinafter referred to as the maximum threshold voltage Vmax), and outputs a second comparison signal S2 in accordance with the comparison result. In the present embodiment, the second comparison signal S2 will be at a high level when Vout>Vmax, and will be at a low level when Vout<Vmax.

The toggle circuit 36 receives the second comparison signal S2 that is output from the second comparator COMP2, so as to generate a toggle signal that undergoes level transition between the two values of high and low each time the second comparison signal S2 reaches a predetermined level (high level), and outputs the toggle signal to the outside of the triangular-wave generating circuit 30 as a synchronization signal SYNC_OUT. Here, the second comparison signal S2 will be at a high level each time the triangular-wave signal Vosc reaches the peak, namely, for every one period. Therefore, the frequency of the synchronization signal SYNC_OUT generated by the toggle operation will be ½ of the frequency of the triangular-wave signal Vosc.

Figure 4:
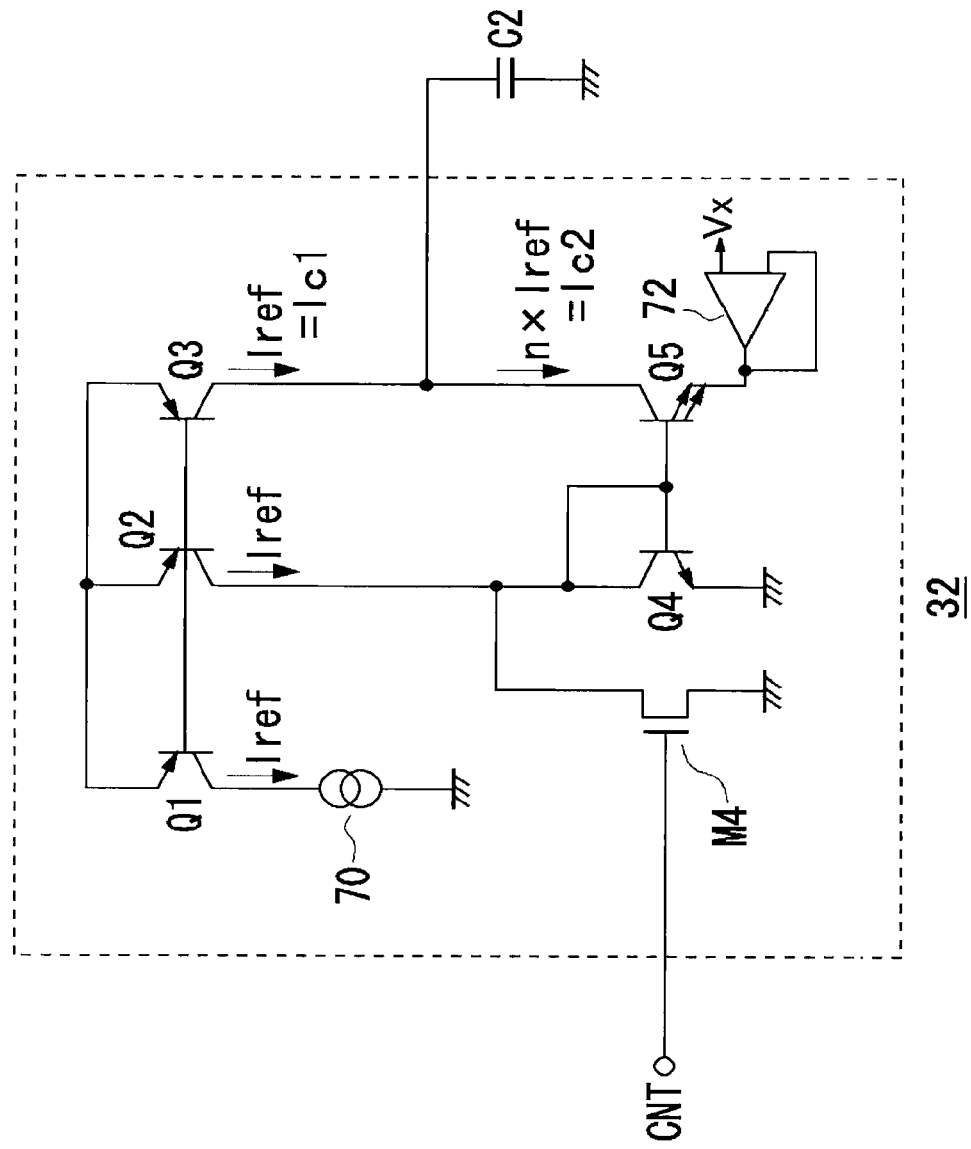
FIG. 4 is a circuit diagram showing a construction example of a charge-discharge circuit.

FIG. 4 is a circuit diagram showing a construction example of the charge-discharge circuit 32. The charge-discharge circuit 32 includes a constant-current source 70, bipolar transistors Q1 to Q5, a MOS transistor M4, and a voltage follower 72. The bipolar transistor Q3 corresponds to the first current source 32a of FIG. 1, and the bipolar transistor Q5 corresponds to the second current source 32b. The constant-current source 70 generates a reference current Iref. The bipolar transistor Q1 is disposed on the path of the reference current Iref generated by the constant-current source 70. The bipolar transistors Q2, Q3 have a base and an emitter commonly connected to those of the bipolar transistor Q1, thereby constituting a current mirror circuit. The bipolar transistors Q4, Q5 are disposed on the current path of the bipolar transistors Q2, Q3. The bipolar transistors Q4, Q5 have a commonly connected base, thereby constituting a current mirror circuit. The emitter of the bipolar transistor Q4 is grounded, and the voltage follower 72 is connected to the emitter of the bipolar transistor Q5. The voltage follower 72 fixes the voltage of the emitter of the bipolar transistor Q5 to be a predetermined voltage Vx. For example, the transistor size of the bipolar transistors Q1 to Q4 are set to be identical, and the transistor size of the bipolar transistor Q5 is set to be n-times as large as that.

The MOS transistor M4 is disposed between the base of the bipolar transistor Q4 and the ground, and the control signal CNT is input to the gate thereof.

When the control signal CNT reaches a high level, the MOS transistor M4 is turned on, and the bipolar transistors Q4, Q5 are turned off. As a result thereof, the reference current Iref that flows through the bipolar transistor Q3 flows into the capacitor C2 as a first current Ic1, whereby the capacitor C2 is set to be in a charge state.

On the other hand, when the control signal CNT is at a low level, the MOS transistor M4 is turned off, whereby the reference current Iref flows through the bipolar transistor Q3, and an electric current n-times as large as the reference current Iref flows through the bipolar transistor Q5. As a result thereof, an electric current of (n−1)×Iref is drawn out from the capacitor C2 as a second current Ic2, whereby the capacitor C2 is set to be in a discharge state.

Also, in the charge-discharge circuit 32 of FIG. 4, the voltage follower 72 fixes the emitter of the bipolar transistor Q5 to have the voltage Vx. As a result thereof, when the collector voltage of the bipolar transistor Q5, namely, the voltage of the capacitor C2, drops to lower than or equal to a predetermined voltage, the bipolar transistor Q5 is saturated, thereby losing the discharging function. Preferably, the voltage Vx has value lower than or equal to the minimum level of the triangular-wave signal Vosc.

Figure 5:
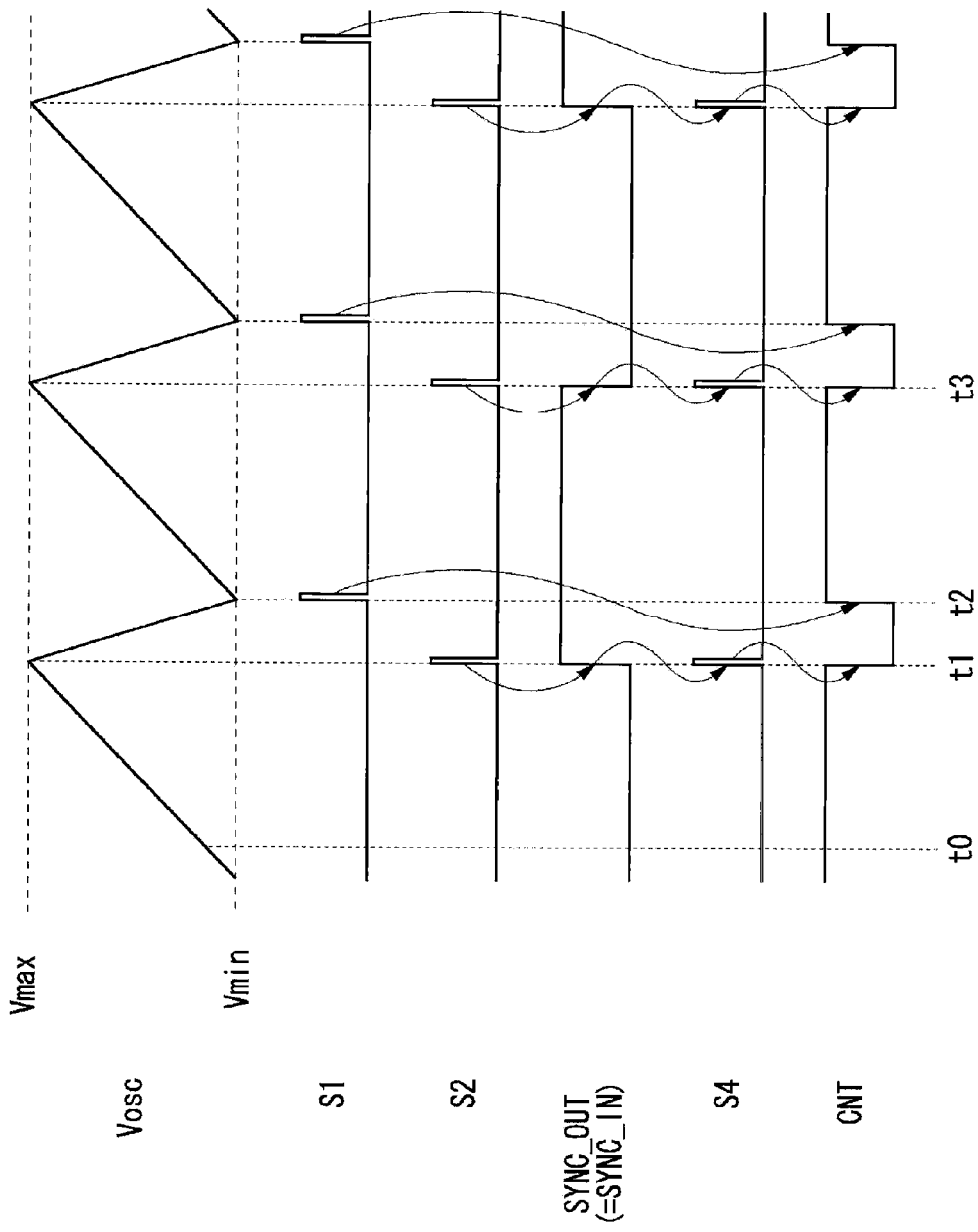
FIG. 5 is a time chart showing an operation state of a triangular-wave generating circuit according to an embodiment.

An operation of the triangular-wave generating circuit 30 constructed as shown above will be described with reference to FIG. 5. FIG. 5 is a time chart showing an operation state of the triangular-wave generating circuit 30 according to the embodiment.

The time chart of FIG. 5 shows a triangular-wave signal Vosc, a first comparison signal S1, a second comparison signal S2, a synchronization signal SYNC_OUT, an edge detection signal S4, and a control signal CNT in the order from the top to the bottom.

At a certain time point t0, the control signal CNT is at a high level, and the charge-discharge circuit 32 is set to be in a charge state. When the capacitor C2 is charged, the triangular-wave signal Vosc rises with a constant gradient. When the triangular-wave signal Vosc reaches the maximum threshold voltage Vmax at the time point t1, the second comparison signal S2 which is an output of the second comparator COMP2 will be at a high level. When the second comparison signal S2 reaches the high level, the synchronization signal SYNC_OUT which is an output signal of the toggle circuit 36 undergoes level transition.

In FIG. 2, the triangular-wave generating circuit 30a on the master side receives the synchronization signal SYNC_OUT that has been output from itself as a synchronization signal SYNC_IN. Also, the triangular-wave generating circuit 30b on the slave side of FIG. 2 receives the synchronization signal SYNC_OUT that has been output from the triangular-wave generating circuit 30a on the master side as a synchronization signal SYNC_IN. Therefore, the time chart of FIG. 5 is shown assuming that SYNC_IN=SYNC_OUT. Here, description will be given assuming that no delay is present between the two signals.

The synchronization signal SYNC_IN is subjected to level conversion by the third comparator COMP3. In the time chart of FIG. 5, the signal S3 subjected to the level conversion has the same waveform as the synchronization signal SYNC_IN. When the edge detection circuit 34 detects an edge of the synchronization signal SYNC_IN (=S3) at the time point t1, the edge detection signal S4 undergoes transition to the high level. When the edge detection signal S4 undergoes transition to the high level, the charge-discharge controller 40 is reset, whereby the control signal CNT undergoes transition to the low level. As a result thereof, the second current source 32b is turned on, whereby the discharge by the charge-discharge circuit 32 is started.

By discharging, the voltage Vosc of the capacitor C2 lowers with lapse of time. When the triangular-wave signal Vosc lowers to the minimum threshold voltage Vmin at the time point t2, the first comparison signal S1 which is an output of the first comparator COMP1 will be at a high level, whereby the charge-discharge controller 40 is set. When the charge-discharge controller 40 is set, the control signal CNT will be at a high level, whereby the second current source 32b is turned off, and the charge-discharge circuit 32 is set to be in a charge state. As a result thereof, the voltage Vosc of the capacitor C2 starts rising again.

When the triangular-wave signal Vosc reaches the maximum threshold voltage Vmax at the time point t3, the second comparison signal S2 will be at a high level by passing through a process similar to that of the time point t1. When the second comparison signal S2 reaches the high level, the synchronization signal SYNC_OUT which is an output of the toggle circuit 36 undergoes transition to the low level. This means that the synchronization signal SYNC_IN undergoes transition to the low level, so that this transition is detected by the edge detection circuit 34, and the edge detection signal S4 reaches the high level again.

By repeating the above-described process, triangular-wave signals Vosc that are synchronized with each other at the same frequency can be generated in a plurality of triangular-wave generating circuits 30.

Figure 6:
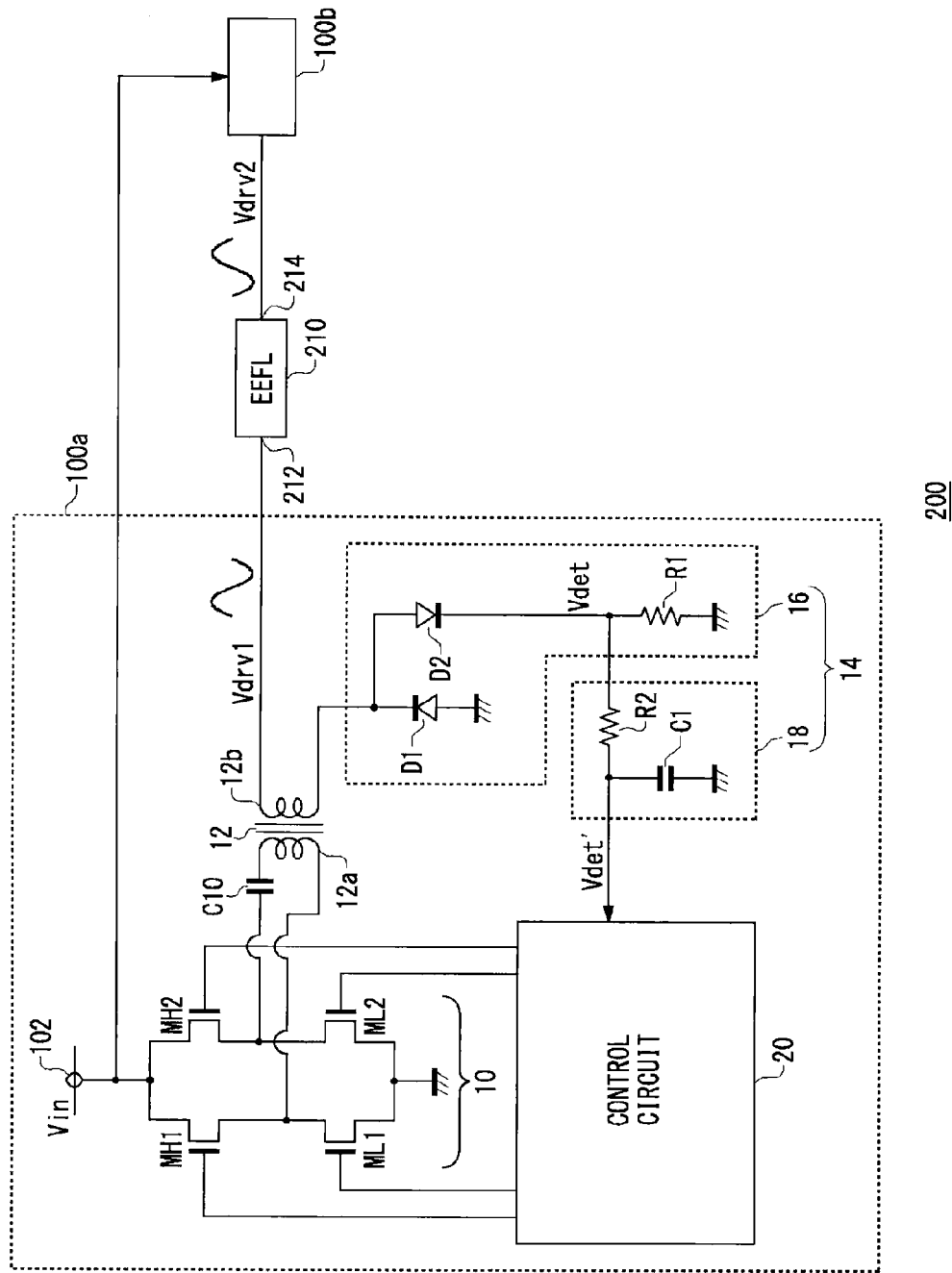
FIG. 6 is a circuit diagram showing a construction of a light-emitting apparatus according to an embodiment.
Figure 7:
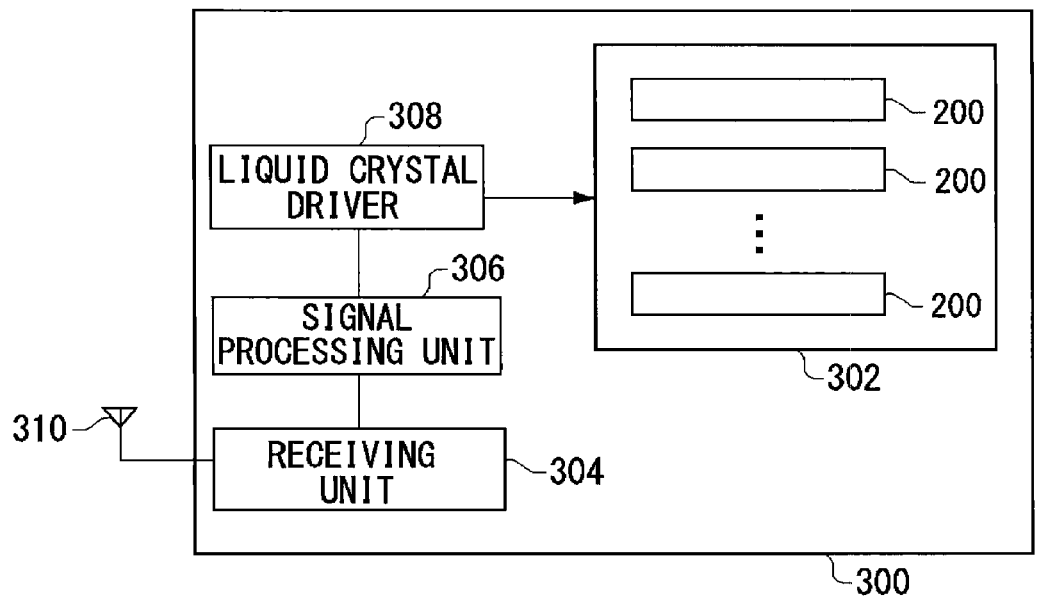
FIG. 7 is a block diagram showing a construction of a liquid crystal television set on which the light-emitting apparatus of FIG. 6 is mounted.

Next, an applied example of the triangular-wave generating circuit 30 constructed as shown above will be described. FIG. 6 is a circuit diagram showing a construction of a light-emitting apparatus 200 according to the embodiment. FIG. 7 is a block diagram showing a construction of a liquid crystal television set 300 on which the light-emitting apparatus 200 of FIG. 6 is mounted. The liquid crystal television set 300 is connected to an antenna 310. The antenna 310 receives a broadcast wave and outputs a received signal to a receiving unit 304. The receiving unit 304 detects and amplifies the received signal, and outputs it to a signal processor 306. The signal processor 306 outputs an image data obtained by demodulating the modulated data to a liquid crystal driver 308. The liquid crystal driver 308 outputs the image data to a liquid crystal panel 302 for each scanning line, and displays video images and picture images. A plurality of light-emitting apparatus 200 are disposed on the back surface of the liquid crystal panel 302 as back light units. The light-emitting apparatus 200 according to the present embodiment can be suitably used as a back light unit of the liquid crystal panel 302 such as this. Hereinafter, returning to FIG. 6, a construction and an operation of the light-emitting apparatus 200 will be described in detail.

The light-emitting apparatus 200 according to the present embodiment includes a fluorescent lamp 210, a first inverter 100a, and a second inverter 100b. The fluorescent lamp 210 is, for example, a CCFL (Cold Cathode Fluorescence Lamp) or an EEFL (External Electrode Fluorescence Lamp), and is disposed on the back surface of the liquid crystal panel 302. The first inverter 100a and the second inverter 100b, which are DC/AC converters, convert an input voltage Vin that has been output from a direct current source into an AC voltage, raise the voltage, and supply a first driving voltage Vdrv1 and a second driving voltage Vdrv2 respectively to a first terminal 212 and a second terminal 214 of the fluorescent lamp 210. The first driving voltage Vdrv1 and the second driving voltage Vdrv2 are AC voltages having phases that are opposite to each other.

In FIG. 6, one fluorescent lamp 210 is shown; however, a plurality thereof may be disposed in parallel. Hereinafter, a construction of the first inverter 100a and the second inverter 100b according to the present embodiment will be described. Since the first inverter 100a and the second inverter 100b have a similar construction, description will be given by generally referring to the two as an inverter 100 without making a distinction between the two. Also, the control circuit 20 of the first inverter 100a and the control circuit of the second inverter 100b correspond to the first circuit 410 and the second circuit 420 in the system 400 of FIG. 2, respectively.

The inverter 100 includes an H bridge circuit 10, a transformer 12, a current-voltage converter 14, a control circuit 20, and a capacitor C10.

The H bridge circuit 10 includes four power transistors made of a first high-side transistor MH1, a first low-side transistor ML1, a second high-side transistor MH2, and a second low-side transistor ML2.

The first high-side transistor MH1 has one end connected to the input terminal 102 to which the input voltage is applied and the other end connected to the first terminal of the primary coil 12a of the transformer 12. The first low-side transistor ML1 has one end connected to the ground terminal having a fixed electric potential and the other end connected to the first terminal of the primary coil 12a. The second high-side transistor MH2 has one end connected to the input terminal 102 and the other end connected to the second terminal of the primary coil via the capacitor C10 for obstructing the direct current. The second low-side transistor ML2 has one end connected to the ground terminal and the other end connected to the second terminal of the primary coil 12a via the capacitor C10 for obstructing the direct current.

The current-voltage converter 14 is disposed between the secondary coil 12b of the transformer 12 and the ground. The current-voltage converter 14 converts the electric current flowing through the secondary coil 12b, namely the electric current flowing through the fluorescent lamp 210, into a voltage for output as a detection voltage Vdet'. The current-voltage converter 14 includes a rectification circuit 16 and a filter 18.

The rectification circuit 16 includes a first diode D1, a second diode D2, and a resistor R1. The first diode D1 has an anode grounded and a cathode connected to one end of the secondary coil 12b. The anode of the second diode D2 is connected to the cathode of the first diode D1. The resistor R1 is disposed between the cathode of the second diode D2 and the ground. The alternating current that flows through the secondary coil 12b is subjected to half-wave rectification by the first diode D1 and the second diode D2, and flows through the resistor R1. A voltage drop proportional to the electric current flowing through the secondary coil 12b is generated at the resistor R1. The rectification circuit 16 outputs the voltage drop generated at the resistor R1 as a detection voltage Vdet.

The filter 18 is a low-pass filter including a resistor R2 and a capacitor C1. The filter 18 feeds the detection voltage Vdet' obtained by removing high-frequency components from the detection voltage Vdet back to the control circuit 20.

The control circuit 20 controls on-off of the first high-side transistor MH1, the first low-side transistor ML1, the second high-side transistor MH2, and the second low-side transistor ML2 of the H bridge circuit 10 on the basis of the fed-back detection voltage Vdet'. By control of the H bridge circuit 10, a switching voltage is supplied to the primary coil 12a of the transformer 12. As a result thereof, energy conversion is carried out in the transformer 12, whereby a first driving voltage Vdrv1 is supplied to the fluorescent lamp 210 connected to the secondary coil 12b.

Figure 8:
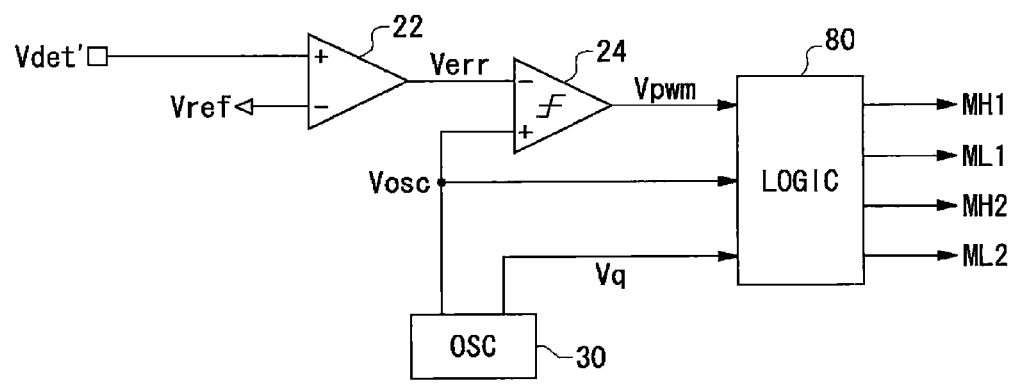
FIG. 8 is a circuit diagram showing a construction of a control circuit according to the present embodiment.

Hereinafter, a construction of the control circuit 20 will be described. FIG. 8 is a circuit diagram showing a construction of the control circuit 20 according to the present embodiment. The control circuit 20 includes an error amplifier 22, a PWM comparator 24, a triangular-wave generating circuit 30, and a logic controller 80, and is a functional IC monolithically integrated on one semiconductor substrate.

The detection voltage Vdet' fed back from the current-voltage converter 14 is input into the non-inverting input terminal of the error amplifier 22, and a predetermined reference voltage Vref is input into the inverting input terminal of the error amplifier 22. The reference voltage Vref is determined in accordance with the luminescence brightness of the fluorescent lamp 210. The error amplifier 22 outputs an error voltage Verr in accordance with the error between the detection voltage Vdet' and the reference voltage Vref.

The triangular-wave generating circuit 30, which is the triangular-wave generating circuit 30 of FIG. 1, generates a triangular-wave signal Vosc having a triangular shape and having a predetermined frequency.

The PWM comparator 24 compares the error voltage Verr output from the error amplifier 22 with the triangular-wave signal Vosc that is output from the triangular-wave generating circuit 30, and generates a pulse width modulation signal (hereinafter referred to as a PWM signal) Vpwm that will be at a high level when Verr<Vosc and will be at a low level when Verr>Vosc. This PWM signal Vpwm is input into the logic controller 80 together with the triangular-wave signal Vosc and a synchronization signal Vq. Here, the synchronization signal Vq that is output from the triangular-wave generating circuit 30 is an input signal of the edge detection circuit 34, namely, the output signal of the third comparator COMP3.

The logic controller 80 controls on-off of the first high-side transistor MH1, the first low-side transistor ML1, the second high-side transistor MH2, and the second low-side transistor ML2 of the H bridge circuit 10 on the basis of the PWM signal Vpwm, the triangular-wave signal Vosc, and the synchronization signal Vq. Hereinafter, the logic controller 80 will be described.

The logic controller 80 controls the H bridge circuit 10 using, as one cycle, two periods of the triangular-wave signal Vosc that is output from the triangular-wave generating circuit 30. More specifically, two periods of the triangular-wave signal Vosc are divided into six time periods made of first to sixth time periods, for performing switching control. FIGS. 9A to 9H are time charts showing an operation state of the inverter 100. FIG. 9A shows the error voltage Verr and the triangular-wave signal Vosc; FIG. 9B shows the PWM signal Vpwm; FIG. 9C shows the synchronization signal Vq; FIGS. 9D to 9G show the states of the first high-side transistor MH1, the second high-side transistor MH2, the first low-side transistor ML1, and the second low-side transistor ML2, respectively; and FIG. 9H shows the electric potential Vsw of the first terminal of the primary coil 12a of the transformer 12. In FIGS. 9D to 9G, the high level represents the on-state of the transistor, and the low level represents the off-state of the transistor. Also, in these Figures, the longitudinal axis and the lateral axis are suitably enlarged or diminished for simplifying the description.

First, the division of the first time period φ1 to the sixth time period φ6 will be described. The logic synthesizer 42 assumes the time period during which the triangular-wave signal Vosc reaches from the bottom edge thereof to the error voltage Verr to be the first time period φ1. Next, the time period until the triangular-wave signal Vosc reaches the peak edge is assumed to be the second time period φ2. Next, the time period until the triangular-wave signal Vosc reaches the bottom edge is assumed to be the third time period φ3. Next, the time period until the triangular-wave signal Vosc reaches the error voltage Verr again is assumed to be the fourth time period φ4. Next, the time period until the triangular-wave signal Vosc reaches the peak edge again is assumed to be the fifth time period φ5.

Next, the time period until the triangular-wave signal Vosc reaches the bottom edge again is assumed to be the sixth time period φ6. This division can be constructed with use of a general logic circuit on the basis of the PWM signal Vpwm and the synchronization signal Vq.

Next, description will be made on the on-off state of the transistors of the H bridge circuit 10 from the first time period φ1 to the sixth time period φ6.

The logic controller 80 turns the first high-side transistor MH1 and the second low-side transistor ML2 on in the first time period φ1, and turns the other transistors off. In the subsequent second time period φ2, the logic controller 80 turns the first high-side transistor MH1 on, and turns the other transistors off. In the subsequent third time period φ3, the logic controller 80 turns the second high-side transistor MH2 on, and turns the other transistors off. In the subsequent fourth time period φ4, the logic controller 80 turns the first low-side transistor ML1 and the second high-side transistor MH2 on, and turns the other transistors off. In the subsequent fifth time period φ5, the logic controller 80 turns the second high-side transistor MH2 on, and turns the other transistors off. In the subsequent sixth time period φ6, the logic controller 80 turns the first high-side transistor MH1 on, and turns the other transistors off. Subsequently, the flow returns to the first period φ1.

An operation of the inverter 100 according to the present embodiment constructed as shown above will be described. FIGS. 10A to 10F are circuit diagrams showing the flow of electric current of the H bridge circuit 10 of the inverter 100 according to the present embodiment. FIGS. 10A to 10F show states of the on-off state of each transistor and the state of the coil current Isw in the first time period φ1 to the sixth time period φ6.

As shown in FIG. 10A, in the first time period φ1, the first high-side transistor MH1 and the second low-side transistor ML2 are turned on. As a result thereof, the coil current Isw flows through the passageway of the first high-side transistor MH1, the primary coil 12a, and the second low-side transistor ML2. The switching voltage Vsw during this time period will be a voltage approximately equal to the input voltage Vin. In the first time period φ1, the coil current Isw gradually increases.

In the subsequent second time period φ2, as shown in FIG. 10B, the second low-side transistor ML2 is turned off, and only the first high-side transistor MH1 is turned on. As a result thereof, a regenerating current flows through the body diode of the second high-side transistor MH2 by the energy stored in the primary coil 12a. During this time period, the switching voltage Vsw is maintained to be the voltage approximately equal to the input voltage.

Next, in the third time period φ3, as shown in FIG. 10C, the second high-side transistor MH2 is switched to be on, and the first high-side transistor MH1 is turned off. During this time period, the coil current Isw having been supplied from the first high-side transistor MH1 in the second time period φ2 will be supplied from the ground via the body diode of the first low-side transistor ML1. The switching voltage Vsw of the third time period φ3 will have a negative value lower than the ground electric potential (0V) by the amount of the forward voltage Vf of the body diode of the first low-side transistor ML1. Also, all of the energy stored in the primary coil 12a during the first time period φ1 will be transferred to the secondary coil 12b in the third time period φ3, and the coil current Isw will be 0.

In the subsequent fourth time period φ4, as shown in FIG. 10D, the first low-side transistor ML1 will be switched to be on in a state in which the second high-side transistor MH2 is maintained to be on. During this time period, the switching voltage Vsw is fixed to be close to the ground electric potential. Also, the coil current Isw will flow from the right side to the left side of the primary coil 12a through the passageway including the second high-side transistor MH2, the primary coil 12a, and the first low-side transistor ML1. During the fourth time period φ4, the coil current Isw will gradually increase.

In the subsequent fifth time period φ5, as shown in FIG. 10E, the first low-side transistor ML1 will be switched to be off while the second high-side transistor MH2 is maintained to be on. As a result thereof, the coil current Isw having been flowing through the first low-side transistor ML1 during the fourth time period φ4 will flow through the body diode of the first high-side transistor MH1. The switching voltage Vsw during this time period will have a voltage higher than the input voltage Vin by the amount of the forward voltage Vf of the body diode.

Next, in the subsequent sixth time period φ6, as shown in FIG. 10F, the first high-side transistor MH1 is switched to be on, and the second high-side transistor MH2 is turned off. During this time period, the coil current Isw having been supplied from the second high-side transistor MH2 in the fifth time period φ5 will be supplied from the ground via the body diode of the second low-side transistor ML2. The switching voltage Vsw of the sixth time period φ6 will be approximately equal to the input voltage Vin. All of the energy stored in the primary coil 12a during the fourth time period φ4 will be transferred to the secondary coil 12b in the sixth time period φ6, and the coil current Isw will be 0.

According to the inverter 100 of the present embodiment, the transistors constituting the H bridge circuit 10 are driven by monitoring the electric current flowing through the secondary coil 12b of the transformer 12 and comparing it with the triangular-wave signal Vosc. Therefore, by adjusting the shape of the triangular-wave signal Vosc, the timing of the on-off of each transistor can be flexibly adjusted.

For example, in the present embodiment, the length of the first time period φ1 and the fourth time period φ4 is dependent on the gradient of the transition from the bottom edge to the peak edge of the triangular-wave signal Vosc. This gradient can be changed by adjusting the charging electric current in the triangular-wave generating circuit 30 of FIG. 1.

Also, in the present embodiment, the transition time period from the peak edge to the bottom edge of the triangular-wave signal Vosc is set to be the third time period φ3 and the sixth time period φ6. The length of the third time period φ3 and the sixth time period φ6 can be changed by adjusting the discharging current in the triangular-wave generating circuit 30 of FIG. 1.

Here, the energy stored in the primary coil 12a is dependent on the length of the first time period φ1 and the fourth time period φ4. Also, the energy stored during the first time period φ1 and the fourth time period φ4 is transferred to the secondary coil 12b during the third time period φ3 and the sixth time period φ6. Therefore, a highly efficient driving can be made by adjusting the shape and the period of the triangular-wave signal Vosc in accordance with the characteristics of the transformer 12 and the characteristics of the fluorescent lamp 210 serving as the target of driving.

The above-described embodiments are merely an exemplification, and it will be understood by those skilled in the art that various modifications can be made on the combination of those constituent elements and treating processes, and that such modifications are also within the scope of the present invention.

In the embodiment, description has been made on a case in which a synchronization operation is carried out using one channel as a master and the other channel as a slave in the triangular-wave generating circuit 30 of two channels. However, the present invention is not limited to this alone, so that a synchronization operation can also be carried out by further disposing a plurality of slave triangular-wave generating circuits 30. Further, a synchronization operation can be carried out by allowing all to operate as slaves and inputting a clock signal having a predetermined frequency as a synchronization signal SYNC_IN from outside.

The following modification can be conceived as the control of the H bridge circuit 10 by the logic controller 80. In the present modification, the logic controller 80 during the fifth time period φ5 maintains the first high-side transistor MH1 to be off during the time period until a predetermined first off-time Toff1 passes since the triangular-wave signal Vosc reaches the error voltage Verr, and turns the first high-side transistor MH1 on after the first off-time Toff1 passes.

Further, the logic controller 80 also during the second time period φ2 maintains the second high-side transistor MH2 to be off during the time period until a predetermined second off-time Toff2 passes since the triangular-wave signal Vosc reaches the error voltage Verr, and turns the second high-side transistor MH2 on after the second off-time Toff2 passes. The first off-time Toff1 and the second off-time Toff2 can be set to be about 50 ns to 200 ns in accordance with the period of the triangular-wave signal Vosc.

FIGS. 11A to 11E are time charts showing an operation state of the inverter 100 according to the modification. FIG. 11A shows the on-off state of the first high-side transistor MH1; FIG. 11B shows the on-off state of the second high-side transistor MH2; FIG. 11C shows the on-off state of the first low-side transistor ML1; and FIG. 11D shows the on-off state of the second low-side transistor ML2. FIG. 11E shows the switching voltage Vsw.

When the second high-side transistor MH2 is kept being off during the fifth time period φ5, the coil current Isw flows through the body diode (parasitic diode) of the second high-side transistor MH2, whereby a voltage drop for the amount of the forward voltage Vf will be generated to increase the electric power loss. Therefore, in the present modification, the first high-side transistor MH1 is turned on after the predetermined first off-time Toff1 passes during the fifth time period φ5. As a result thereof, as shown in FIG. 11E, the switching voltage Vsw drops to the input voltage Vin after the first off-time Toff1 passes. During this time period, the coil current Isw having been flowing through the body diode of the first high-side transistor MH1 will flow through the first high-side transistor MH1, so that the electric power loss can be reduced. Also, by suitably setting the first off-time Toff1, one can prevent the penetrating current to flow due to simultaneous turn-on of the first high-side transistor MH1 and the first low-side transistor ML1.

Similarly, in the second time period φ2 also, if the second high-side transistor MH2 is kept being off, an electric current flows through the body diode thereof, so that the electric power loss will be large. Therefore, the electric power loss can be reduced by allowing an electric current to flow through the second high-side transistor MH2 by turning the second high-side transistor MH2 on after the predetermined second off-time Toff2 passes.

The first off-time Toff1 and the second off-time Toff2 may be determined in accordance with the characteristics of the transformer 12, and are preferably set within a range from 30 ns to 150 ns. More preferably, when they are set within a range from 50 ns to 100 ns, the electric power loss can be reduced.

In the present embodiment, the control circuit 20 may all be monolithically integrated, or alternatively a part thereof may be constructed with discrete components or chip components. Also, the control circuit 20 may be integrated by including the H bridge circuit 10. What parts are to be integrated to what degree may be determined in accordance with the specification, the cost, the occupied area, and the like of the inverter 100.

In the present embodiment, the setting of the logic values of the high level and the low level of the logic circuit is merely one example, so that they can be freely changed by suitably inverting with an inverter or the like. For example, the logic controller 80 can control the periods from the first period φ1 to the sixth period φ6 by inverting the peak edge and the bottom edge.

In the embodiment, description has been made on a case in which the high-side transistors among the transistors constituting the H bridge circuit 10 are constructed with N-channel MOSFETs. However, one can also make use of P-channel MOSFETs as well.

In the embodiment, description has been made on a case in which, in the light-emitting apparatus 200, the inverters 100 are connected at both ends of the fluorescent lamp 210, and the fluorescent lamp 210 is driven with driving voltages having opposite phases; however, the present invention is not limited to this alone. Also, the load driven by the inverters 100 according to the present embodiment is not limited to a fluorescent tube, so that the present invention can be applied to driving of various other devices that require a high AC voltage.

In the embodiment, the inverters 100 have been described as an applied example of the triangular-wave generating circuit 30; however, the present invention is not limited to this alone. In addition to the inverters 100 described in the embodiment, the triangular-wave generating circuit 30 according to the present embodiment can be suitably applied to cases in which one wishes to perform synchronization control in power supply apparatus such as a switching regulator, in motor drivers, and in other apparatus.

While the preferred embodiments of the present invention have been described using specific terms, such description is for illustrative purposes only, and it is to be understood that changes and variations may be made without departing from the spirit or scope of the appended claims.

What is claimed is:

1. A triangular-wave generating circuit comprising:
    a capacitor having a fixed electric potential at one end;
    a charge-discharge circuit that charges or discharges said capacitor;
    a first comparator that compares an output voltage of the other end of said capacitor with a first threshold voltage and outputs a first comparison signal in accordance with a comparison result;
    an edge detecting circuit that detects an edge of a synchronization signal input from the outside and having a frequency of about ½ of a triangular-wave signal generated by the triangular-wave generating circuit, and outputs an edge detection signal that will be at a predetermined level for each of the detected edges; and
    a charge-discharge controller that receives said first comparison signal output from said first comparator and said edge detection signal output from said edge detecting circuit, and switches between a charge state and a discharge state of said charge-discharge circuit in accordance with a level transition of these signals, wherein
    a voltage of said capacitor is output as a triangular-wave signal.

2. The triangular-wave generating circuit according to claim 1, wherein
said charge-discharge controller includes a flip-flop that is set and reset by said first comparison signal and said edge detection signal, and switches between the charge state and the discharge state of said charge-discharge circuit in accordance with an output of the flip-flop.

3. The triangular-wave generating circuit according to claim 1, further comprising:
a second comparator that compares a voltage of the other end of said capacitor with a second threshold voltage that is different from said first threshold voltage, and outputs a second comparison signal in accordance with a comparison result; and
a toggle circuit that receives said second comparison signal output from said second comparator, generates a toggle signal that undergoes level transition each time said second comparison signal reaches a predetermined level, and outputs the signal to the outside of the triangular-wave generating circuit.

4. The triangular-wave generating circuit according to claim 1, further comprising a third comparator that compares said synchronization signal input from the outside with a predetermined threshold voltage, wherein
said edge detecting circuit detects an edge of an output signal of said third comparator.

5. The triangular-wave generating circuit according to claim 2, wherein said charge-discharge circuit includes:
a first current source that supplies an electric current into said capacitor, and
a second current source that withdraws an electric current from said capacitor, and
controls on-off of at least one of said first and second current sources with use of an output signal of said flip-flop, and
said second current source loses its discharging function when the voltage of said capacitor drops to lower than or equal to a predetermined voltage.

6. The triangular-wave generating circuit according to claim 1, which is monolithically integrated on one semiconductor substrate.

7. An inverter comprising:
a transformer;
a first high-side transistor having one end connected to an input terminal to which an input voltage is applied and having the other end connected to a first terminal of a primary coil of said transformer;
a first low-side transistor having one end connected to a potential-fixed terminal with a fixed electric potential and having the other end connected to the first terminal of said primary coil;
a second high-side transistor having one end connected to said input terminal and having the other end connected to a second terminal of said primary coil;
a second low-side transistor having one end connected to said potential-fixed terminal and having the other end connected to the second terminal of said primary coil;
a current-voltage converter that converts an electric current through a secondary coil of said transformer into a voltage outputs the voltage as a detection voltage;
a triangular-wave generating circuit according to claim 1 that generates a triangular-wave signal;
an error amplifier that outputs an error voltage in accordance with an error between said detection voltage and a predetermined reference voltage; and
a logic controller that controls on-off of said first and second high-side transistors and said first and second low-side transistors on the basis of said error voltage that is output from said error amplifier and said triangular-wave signal generated by said triangular-wave generating circuit.

8. A light-emitting apparatus comprising:
a fluorescent lamp; and
two inverters according to claim 7 that are disposed at both ends of said fluorescent lamp and supply driving voltages having opposite phases with each other to said fluorescent lamp.

9. The light-emitting apparatus according to claim 8, wherein
said triangular-wave generating circuit included in each of said two inverters further comprises:
a second comparator that compares a voltage of the other end of said capacitor with a second threshold voltage that is different from said first threshold voltage, and outputs a second comparison signal in accordance with a comparison result; and
a toggle circuit that receives said second comparison signal output from said second comparator, generates a toggle signal that undergoes level transition each time said second comparison signal reaches a predetermined level, and outputs the signal to the outside of the triangular-wave generating circuit, wherein
a first triangular-wave generating circuit included in a first inverter of said two inverters generates said triangular-wave signal by receiving said toggle signal output from itself as said synchronization signal, and
a second triangular-wave generating circuit included in a second inverter of said two inverters generates said triangular-wave signal by receiving said toggle signal output from said first triangular-wave generating circuit included in said first inverter as said synchronization signal.

10. A liquid crystal television set comprising:
a liquid crystal panel; and
a plurality of light-emitting apparatus according to claim 8 that are disposed on a back surface of said liquid crystal panel.

11. A method for generating a triangular-wave signal comprising:
generating a first comparison signal that reaches a predetermined level when a voltage of a capacitor having a fixed electric potential at one end drops to a predetermined first threshold voltage while said capacitor is being discharged;
generating a toggle signal that undergoes level transition each time said first comparison signal reaches said predetermined level, and outputting the signal to the outside;
detecting an edge of a synchronization signal input from the outside and having a frequency of about ½ of a triangular-wave signal generated by the present method;
starting charging said capacitor when said edge is detected; and
starting discharging said capacitor when the voltage of said capacitor rises to a predetermined second threshold voltage.

12. The method according to claim 11, wherein said toggle signal is used as said synchronization signal.

* * * * *